US006919608B2

(12) United States Patent
Gregg

(10) Patent No.: US 6,919,608 B2
(45) Date of Patent: Jul. 19, 2005

(54) SPIN TRANSISTOR

(75) Inventor: John Francis Gregg, Oxford (GB)

(73) Assignee: Isis Innovation Limited (GB)

( * ) Notice: Subject to any disclaimer, the term of this patent is extended or adjusted under 35 U.S.C. 154(b) by 103 days.

(21) Appl. No.: 10/221,566

(22) PCT Filed: Mar. 13, 2001

(86) PCT No.: PCT/GB01/01094

§ 371 (c)(1),
(2), (4) Date: Mar. 19, 2003

(87) PCT Pub. No.: WO01/69655

PCT Pub. Date: Sep. 20, 2001

(65) Prior Publication Data

US 2003/0164509 A1 Sep. 4, 2003

(30) Foreign Application Priority Data

Mar. 14, 2000 (GB) .............................. 0006142

(51) Int. Cl.⁷ .............................................. H01L 29/72
(52) U.S. Cl. ...................... 257/423; 257/427; 257/565
(58) Field of Search ............................... 257/295, 423, 257/427, 565

(56) References Cited

U.S. PATENT DOCUMENTS 5,416,353 A * 5/1995 Kamiguchi et al. ......... 257/421
5,747,859 A    5/1998 Mizushima et al.
5,757,056 A * 5/1998 Chui ........................... 257/421
5,962,905 A * 10/1999 Kamiguchi et al. ......... 257/421
5,973,334 A   10/1999 Mizushima et al.
6,218,718 B1 * 4/2001 Gregg et al. ................ 257/421
6,624,490 B2 * 9/2003 Flatte et al. ................ 257/421

* cited by examiner

Primary Examiner—Allan R. Wilson
(74) Attorney, Agent, or Firm—Wolf, Greenfield & Sacks, P.C.

(57) ABSTRACT

A spin transistor (10) comprises a spin injector (50) formed of a ferromagnetic material and constituting the emitter (20) of a three-terminal device, a spin filter (70) also formed of a ferromagnetic material and constituting a collector (40), and a semiconductor base (30) region.

A tunnelling barrier (60) is formed of an insulating metal oxide such as aluminium oxide between the emitter (20) and the base (30). The tunnelling barrier (60) reduces the degree of spin depolarization as carriers are injected into the base (30), and permits selection of spin injection energy. In preferred embodiments, a second tunnelling barrier (80) may be formed between the base (30) and the collector (40). A method of manufacture is also provided.

17 Claims, 11 Drawing Sheets

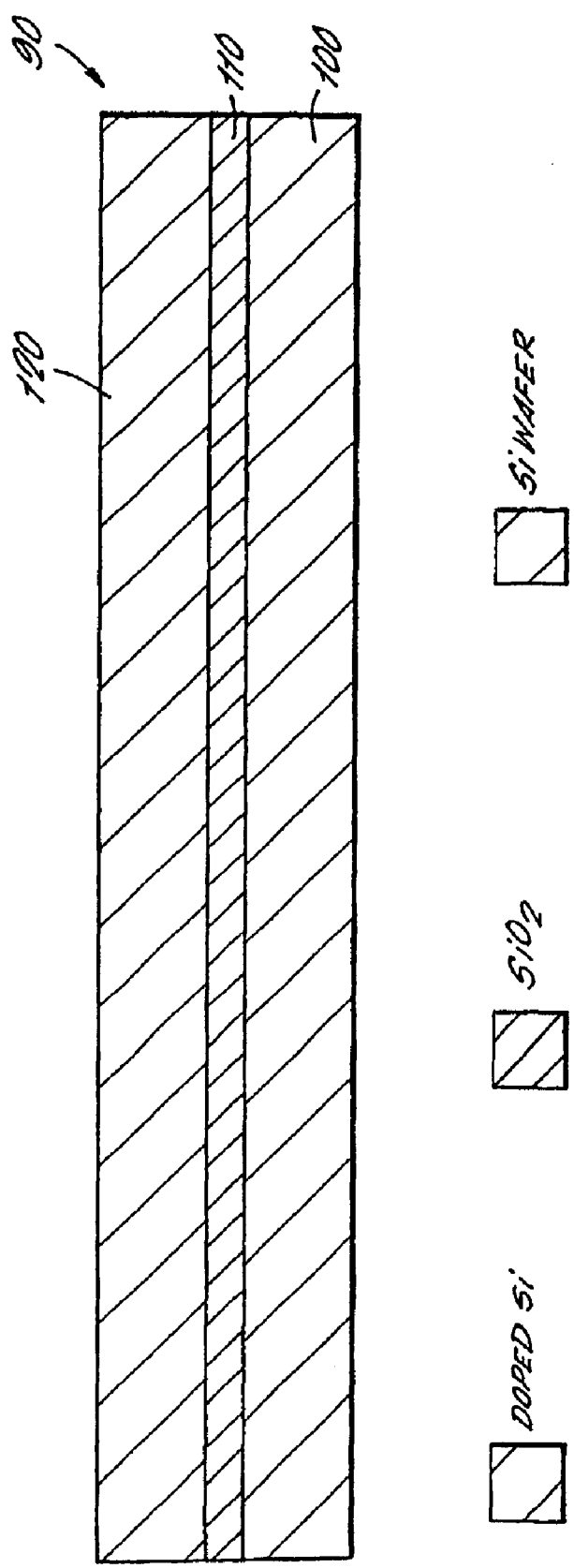
FIG. 4a.
 Si WAFER
 SiO₂
 DOPED Si

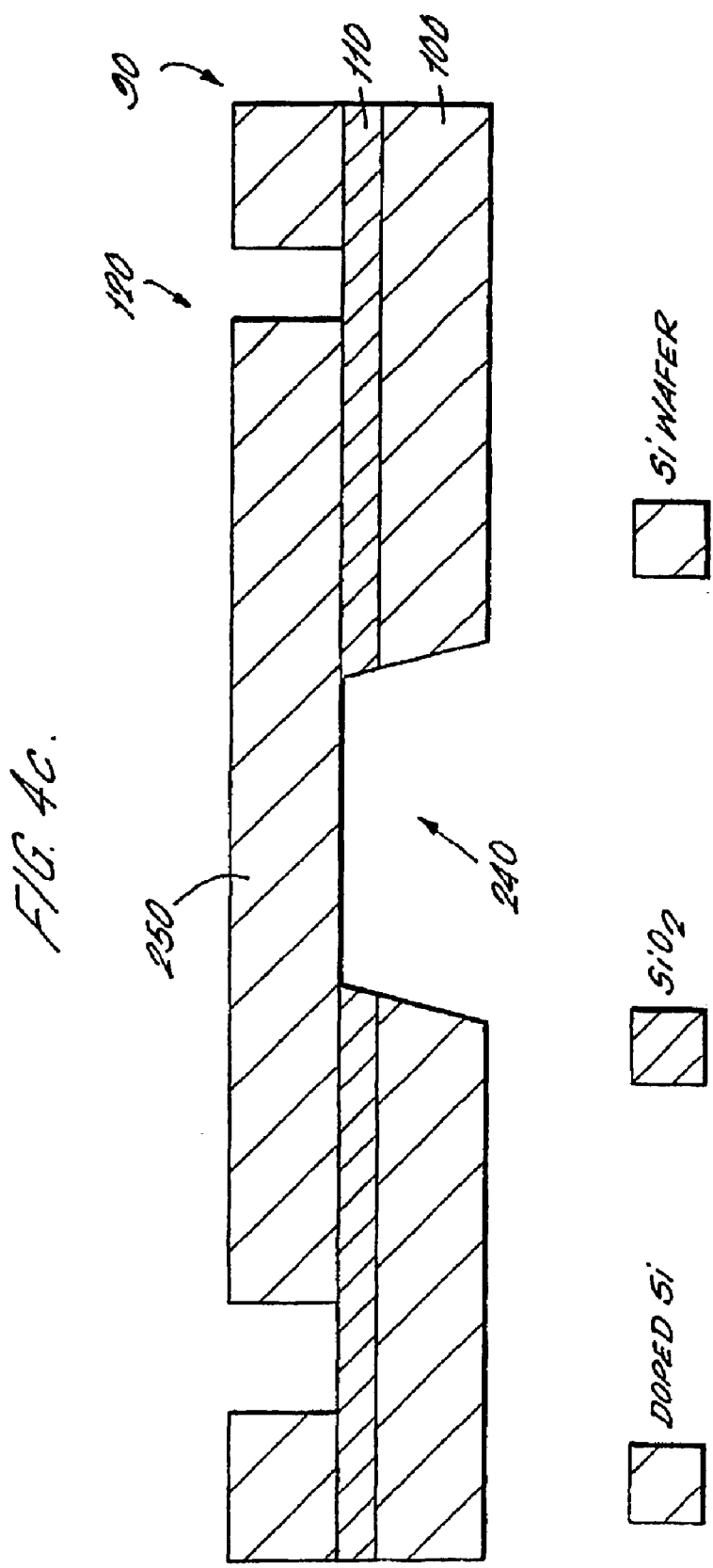

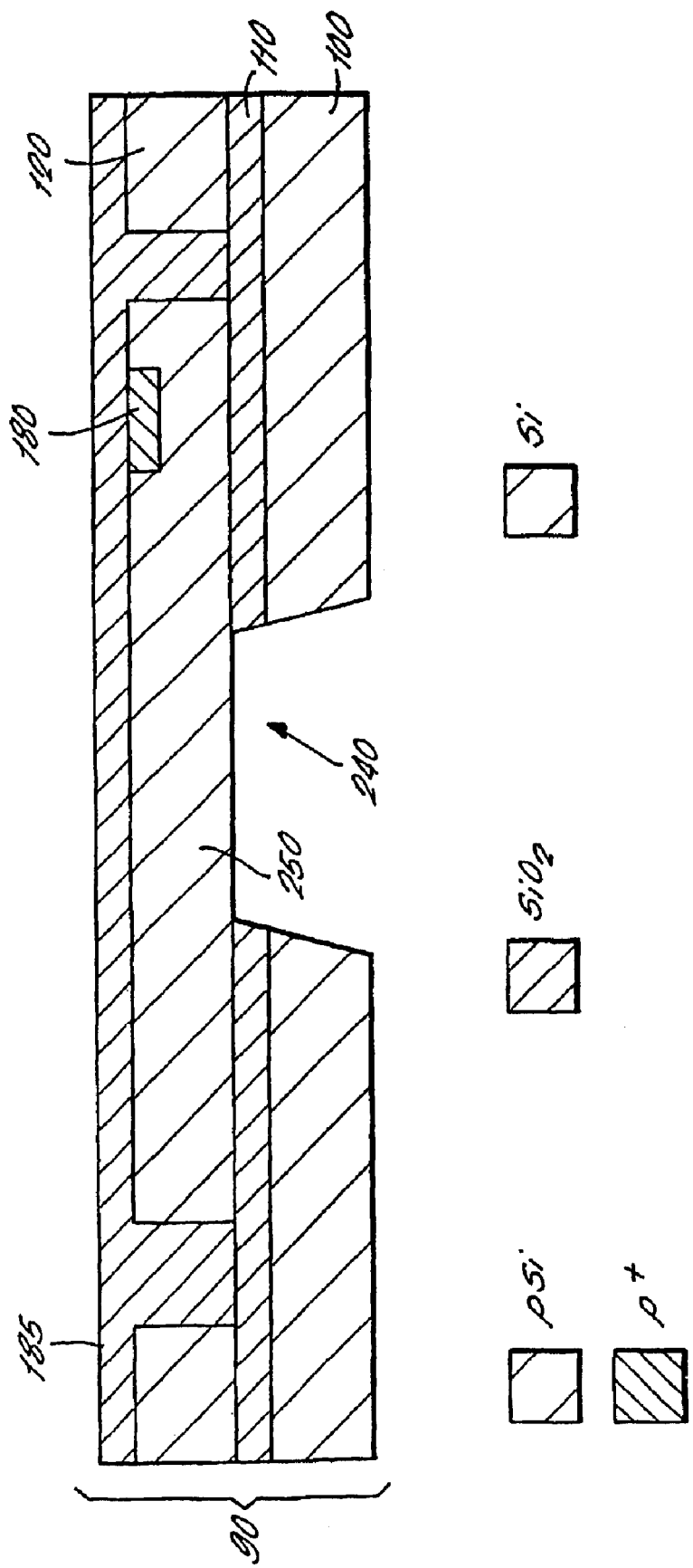

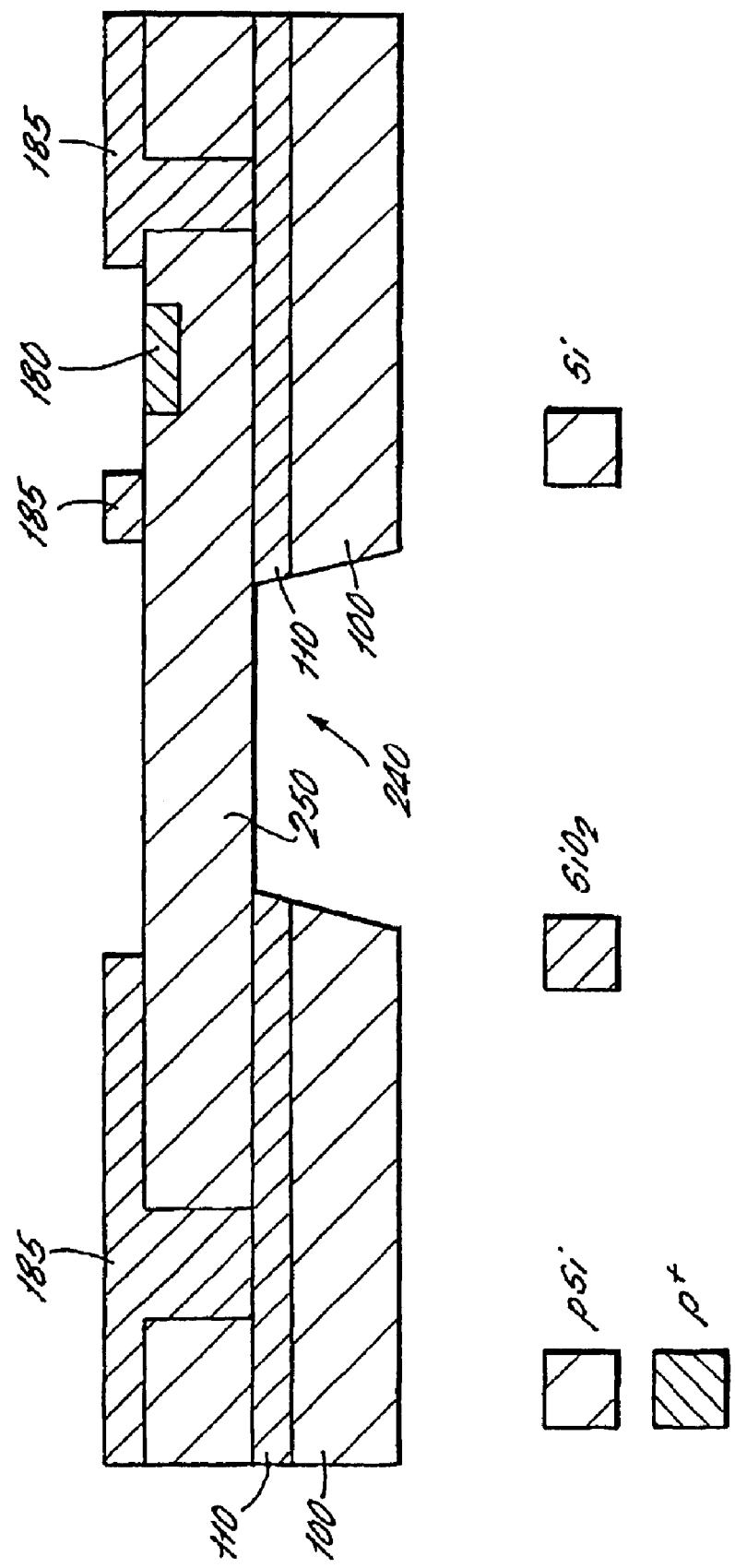

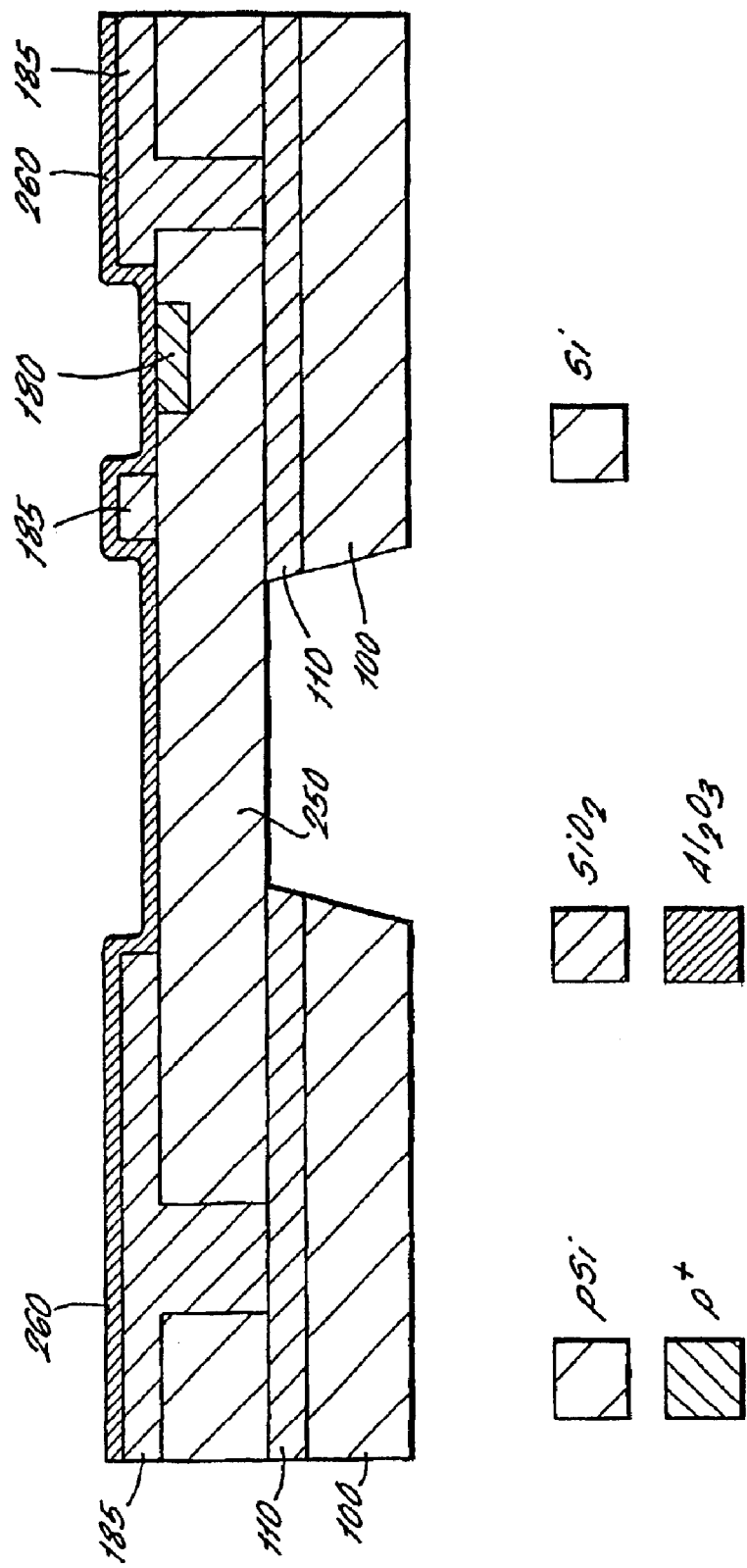

SPIN TRANSISTOR

BACKGROUND

This invention relates to a spin transistor.

Traditional silicon transistors, as is well known, operate through the movement of electrons and holes under the effect of an electric field. Until recently, the fact that some of the electrical carriers have a spin-up configuration and some a spin-down configuration, was ignored.

M. Johnson, in Science, 260, 320 (Apr. 16, 1993), described the first all metal transistor, known as a spin transistor or magnetic transistor. This device comprises a paramagnetic layer sandwiched between two outer ferromagnetic layers to make a trilayer structure. By connecting a terminal to each of the layers, a three-terminal giant magnetoresistive (GMR) device may be formed; by analogy with a traditional silicon transistor, the two outer ferromagnetic layers are referred to as the collector and emitter, and the paramagnetic layer is referred to as the base.

The device operates by pumping electrical current from the ferromagnetic emitter to the paramagnetic base, thus creating a spin accumulation (an excess of up-spin carriers over down-spin carriers or vice versa) in the paramagnetic material. The base can thus be thought of as suffering a divergence in the chemical potentials of the two spin channels (up-spin and down-spin). The collector current is then magnetically dependent.

The Johnson device has two major drawbacks. Firstly, in practice the transistor offers no power gain. Secondly, the signal amplitudes involved are very low (of the order of nanovolts).

More recent developments in the spin transistor have employed two Schottky diodes (silicon/metal stack/silicon), as described by D. Monsma et al. in Physics Review Letters 74, 5260; 1995.

This hybrid device exploits the rectifying properties of semiconductor junctions. The silicon outer layers act as emitter and collector respectively, whilst the intermediate layer (in fact a GMR multilayer) acts as the base. The transistor is biassed to pass current from the (silicon) emitter to the GMR base and the magnetic configuration of the latter governs the ultimate collector current. In particular, the magnetic configuration of the base determines the scattering length within it, which in turn determines the number of charge carriers able to clear the base/collector Schottky barrier. Thus, the device acts as a three-terminal device analogous to a bipolar junction transistor but with the ratio of collector-to-emitter current, i.e. the current gain, being a function of externally applied magnetic field.

The Monsma device, whilst being an excellent magnetic field sensor, still suffers in comparison with traditional silicon transistors. Whilst the ratio of the collector current to base current ($\beta$) varies by a large amount, the absolute value of $\beta$ is less than unity (typically eight orders of magnitude less than a commercial bipolar junction transistor). The Monsma spin transistor has also proved difficult to manufacture commercially because of the need to use cold welding techniques to assemble the device.

WO97/41606 shows a device representing a further improvement to the above. Here, a spin transistor is described which exploits the behaviour of spin-polarized currents in the silicon itself. The spin transistor of WO97/41606 is essentially a three-terminal device with a silicon base, emitter and collector. The emitter includes a spin injector to inject a spin-polarized diffusion current into the silicon base, with a barrier layer employed between the base and a silicon collector. The barrier layer is responsive to a magnetic field and acts to alter the base-collector current.

The device of WO97/41606 thus provides the benefits of a traditional transistor (large $\beta$), because it is partly a silicon device and the carrier transport is thus diffusion-driven and not field-driven in the base. Nonetheless, the device has a degree of magnetic sensitivity because of the use of the barrier layer in combination with spin-polarized carriers. However, the device does still suffer a number of drawbacks. Firstly, the spin-polarized carriers are injected directly into a region where they are majority carriers, and this causes dilution of the spin such that a significant reduction in the number of spin-polarized carriers reaches the collector. Secondly, injecting from a magnetic region directly into silicon across an Ohmic or Schottky barrier causes a strong depolarizing effect, and it is believed that interface contamination or interdiffusion at the Ohmic contact may be one cause of this.

It is an object of the present invention to provide an improved spin transistor which at least alleviates these problems with the prior art.

SUMMARY

According to a first aspect of the present invention, there is provided a spin transistor comprising a first region defining an emitter, a second region defining a semiconductor base, and a third region defining a collector, wherein: the emitter includes a spin polarizer for spin-polarizing charge carriers to be injected from the emitter to the base; and the collector includes a spin filter for spin-filtering charge carriers received at the collector from the base; characterised in that the emitter further includes a tunnelling barrier arranged to tunnel inject the spin-polarized charge carriers into the semiconductor base.

The use of a tunnelling barrier reduces the formation of suicides and other contaminants, since a silicon/insulator interface is formed, rather than a silicon/metal interface. Thus, there is a significant reduction in spin depolarization relative to the prior art. Moreover, the tunnelling barrier height and width may be readily varied, and this in turn allows the point of injection into the band—structure of the silicon base to be varied over a wide range whilst maintaining constant injection current density. The spin injection energy may then be selected so as to maximise the spin sensitivity of the spin transistor.

The collector may further include a second tunnelling barrier, Schottky barrier, Ohmic barrier or p-n semiconductor junction for removal of the spin-polarized carriers from the semiconductor base.

Preferably, the spin polarizer includes a spin asymmetric material to write the spin information to the charge carriers. The spin analyser may likewise include a spin asymmetric material to read the spin information imparted by the spin polarizer. The spin asymmetric material may, for example, be a ferromagnetic metal, such as cobalt. In this case, the magnetization of the spin polarizer relative to the spin analyser may be differentially switched by the application of an external magnetic field. This in turn modifies the transfer functions of the spin transistor. In that case, the coercive fields of the emitter and collector should differ. In the present case, the transfer functions may include the transconductance, defined as $dI(n)/dV(m)$, the current gain, defined as $dI(n)/dI(m)$, and voltage gain which is defined as $dV(n)/dV(m)$. n and m are defined as the first and second of a given pair of terminals in the device respectively. In the case of a three-terminal device, n and m represent the collector and base, collector and emitter, and base and emitter.

The spin transistor may include a further magnetic element incorporated into the base structure, to provide additional magnetic functionality. This potentially allows the transfer functions between more than one pair of ports to be magnetically dependent. The additional magnetic element may, in one embodiment, have a coercive field which is different to the coercive fields of the spin polarizer and spin analyser. In another embodiment, the coercive field of the additional magnetic element may be substantially the same as the coercive fields of the spin polarizer and spin analyser.

Preferably, the spin polarizer further comprises a first semiconductor element for transferring spin-polarized carriers into the base. Likewise, the spin analyser may further comprise a second semiconductor element for transferring spin-polarized carriers from the base.

The spin polarizer, or spin filter may be formed of a magnetic semiconductor material such as Cadmium Mercury Telluride, for example. Similarly, the semiconductor base may also include such a magnetic semiconductor material.

Preferably, the device is formed as a thin film structure.

According to a second aspect of the present invention, there is provided a method of fabricating a spin transistor, comprising the steps of: (a) forming a first region defining an emitter having a spin polarizer for spin-polarizing charge carriers to be injected from the emitter, and an emitter tunnelling barrier; (b) forming a second region defining a semiconductor base for receiving the spin-polarized charge carriers from the emitter via the emitter tunnel barrier; and (c) forming a third region defining a collector, the collector including a spin analyser for spin-analysing charge carriers received at the collector from the base, wherein the base of the spin transistor thus fabricated is adjacent to the emitter tunnel barrier and the collector.

It should be appreciated that the order in which the steps (a) to (c) are carried out is not critical.

Preferably, the step of forming the third region defining the collector further comprises forming a collector tunnelling barrier between the said spin analyser and the semiconductor base, for removing the spin-polarized carriers from the said base. In that case, after the collector tunnelling barrier has been formed, the method may further comprise applying a breakdown voltage to the spin transistor, the breakdown voltage applied being of sufficient magnitude to cause breakdown of the collector tunnelling barrier into a Schottky barrier.

This method of forming a Schottky barrier between the base and collector is particularly advantageous. Indeed, the procedure is not restricted to the formation of a Schottky barrier in the spin transistor of the invention. The present invention thus also provides a method of forming a Schottky barrier, comprising forming a composite structure including a metallic layer, a tunnelling barrier layer and a semiconductive layer, the tunnelling barrier layer being formed between the said metallic layer and the said semiconductive layer; and applying a breakdown voltage to the said composite structure, the breakdown voltage being of sufficient magnitude to cause breakdown of the tunnelling barrier layer into a Schottky barrier layer.

An Ohmic interface may be formed by a similar technique. In yet a further aspect of the invention, there is provided a method of forming an Ohmic interface layer between a metallic and a semiconductive layer, comprising forming a composite structure including a metallic layer, a tunnelling barrier layer and a heavily doped semiconductive layer, the tunnelling barrier layer being formed between the said metallic layer and the said heavily doped semiconductive layer; and applying a breakdown voltage to the said composite structure, the breakdown voltage being of sufficient magnitude to cause breakdown of the tunnelling barrier layer into an Ohmic interface layer.

By "heavily doped" it is meant that the semiconductive region has sufficient numbers of dopant ions that the Fermi energy is almost in the conduction band. This level of doping is referred to in the art as "p+" or "n+" doping. In that case, the interface layer becomes Ohmic. The technique is particularly advantageous in the formation of Ohmic contacts (electrodes) onto a silicon material.

Emitter, base and collector electrodes may be formed on the surfaces of the emitter, base and collector respectively. A base-tunnelling barrier may be formed between the base electrode and the base. In that case, a breakdown voltage may again be applied to cause breakdown of the base-tunnelling barrier into a further Schottky barrier.

When the semiconductor base is heavily doped, application of a breakdown voltage may cause the collector-tunnelling barrier to break down instead into an Ohmic barrier.

BRIEF DESCRIPTION OF THE DRAWINGS

The invention may be put into practice in a number of ways, and one embodiment will now be described by way of example only and with reference to the following drawings in which:

FIGS. 4a–4h show the stages in the fabrication of a further embodiment of the spin transistor in accordance with the present invention.

DETAILED DESCRIPTION

Figure 1:
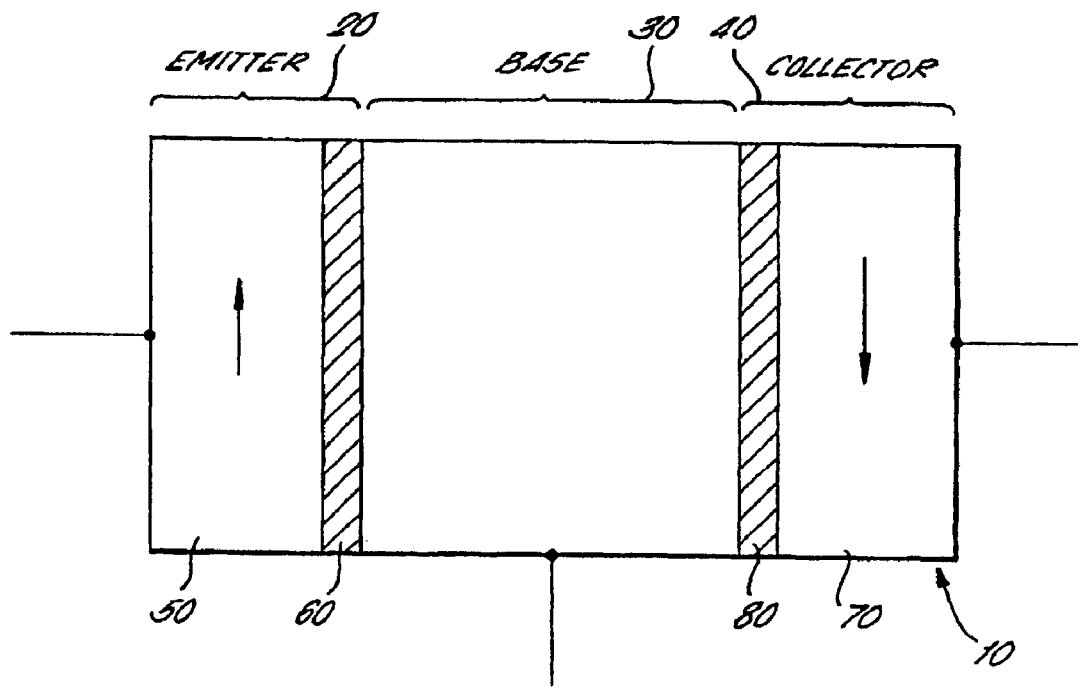
FIG. 1 shows a highly schematic diagram of a spin transistor embodying the present invention.

Referring to FIG. 1, the basic functional features of a spin transistor 10 embodying aspects of the present invention are shown. The spin transistor 10 comprises three regions, which define an emitter 20, base 30 and collector 40. The emitter 20 comprises, in the simplified example of FIG. 1, a spin polarizer 50 and an emitter tunnelling barrier 60. The base is formed of a semiconductor material, in the preferred embodiment p-type doped silicon. The collector 40 includes a spin analyser or filter 70, and a collector-tunnelling junction 80 between the base and the spin filter 70.

The spin polarizer 50 and spin filter 70 are formed of a metallic ferromagnetic material such as nickel, iron, cobalt or permalloy (NiFe). More exotic materials, such as Heusler alloys, or colossal magnetoresistive materials such as manganites (e.g. LSMO) may be used. These materials have a different density of states of the Fermi energy for the "up" and "down" spins. This in turn means that there are different probabilities for tunnelling into and out of these materials, for the up spins and down spins respectively. The asymmetric density of states also translates into different channel mobilities for these materials.

Spin-polarized carriers from the spin polarizer 50 enter the base 30 of the spin transistor 10 via the emitter-tunnelling barrier 60. The tunnelling barrier 60 is typically an insulating metal oxide, such as aluminium oxide. There are several advantages to delivering the carriers into the base 30 via the tunnelling barrier. Firstly, since the silicon of the base 30 abuts an insulator (the emitter tunnelling barrier 60), silicide formation is more easily avoided because compounding between the silicon of the base 30 and the metal oxide of the emitter-tunnelling barrier 60 is less likely to occur. Secondly, the tunnel barrier height and width may be readily varied during fabrication of the spin transistor (as discussed below), and the point of injection into the silicon band structure of the base 30 may be varied over a wide range whilst maintaining constant injection current density. Thus, the spin injection energy may be chosen to maximize the spin sensitivity of the spin transistor 10. Finally, at least in principle, the depolarizing effects and the conductivity differential effect which limit the size of the spin accumulation when Schottky barriers or Ohmic junctions are employed between the spin polarizer and the base may be avoided.

The junction between the collector 40 and the base 30, as shown in FIG. 1, includes a collector tunnelling junction 80. The principles underlying this part of the spin transistor 10 are essentially the same as that discussed above governing the emitter/base junction. However, it is to be appreciated that the problems associated with the emitter/base junction in the prior art are not so problematical at the base/collector junction. Indeed, in order to obtain a reasonable voltage amplification, it is desirable that the spin transistor 10 should have a small output admittance, and in this case a Schottky barrier between the base and the spin filter 70 may be preferable. Tunnelling barriers are Ohmic, and the current obtained at the collector varies appreciably with the collector-emitter voltage. A good Schottky barrier, having few pinholes, will typically have a negligible transconductance (dIc/dVce).

It has been discovered that a good Schottky barrier may be generated between the base 30 and spin filter 70 as follows. A collector tunnelling barrier 80 is first deposited upon the base 30, as described below. The spin filter 70 is then deposited on top of the collector tunnelling junction 80. By applying a pulse of static electricity, the fragile collector tunnelling barrier 80 may be destroyed. The resultant barrier is a diffusionless Schottky barrier. This particular method for forming a Schottky barrier is highly advantageous as it is simple, clinically clean and suppresses the formation of interface compounds in the initial fabrication, maintaining clean, uncontaminated interfaces. The discharge of static electricity forces metal fingers or whiskers into the silicon of the base 30 to form good Schottky contacts. A similar technique may be employed to form an Ohmic contact to the silicon base, for example to allow electrodes to be applied thereto. As before, an insulating layer, for example of aluminium oxide, is laid down, but this time on top of a very highly doped region of semiconductor. When a static pulse is applied, the resulting contact becomes Ohmic and not rectifying. Although the technique is particularly suitable for generating Ohmic electrode contacts, it can of course be employed to create an Ohmic interface between the spin filter 70 and base 30 if this is desirable.

Yet a further structure for receiving charge carriers from the base into the collector employs the concept of a ballistic collector. This is essentially a p-n junction between base and collector as in a conventional npn bipolar transistor, with the refinement that a very thin layer (one or two atomic layers— ie just enough to define a bandstructure) of ferromagnet is introduced into the base region just short of the collector p-n junction. The p material either side of this layer is contiguous by a tortuous path to ensure that the p-bandstructure either side of the ferro layer is at the same height. The collected carriers pass ballistically through the thin ferro layer (which filters one spin polarisation preferentially) and are then collected by the p-n junction. The main problem with this type of base-collector interface is that it is difficult to fabricate.

In use, the spin transistor 10 operates by the injection of spin-polarized carriers into the base, across the emitter tunnelling barrier 60. The proportion of these carriers that are harvested by the collector is a function of the magnetic state of the collector 40, which acts as a spin filter.

Figure 2:
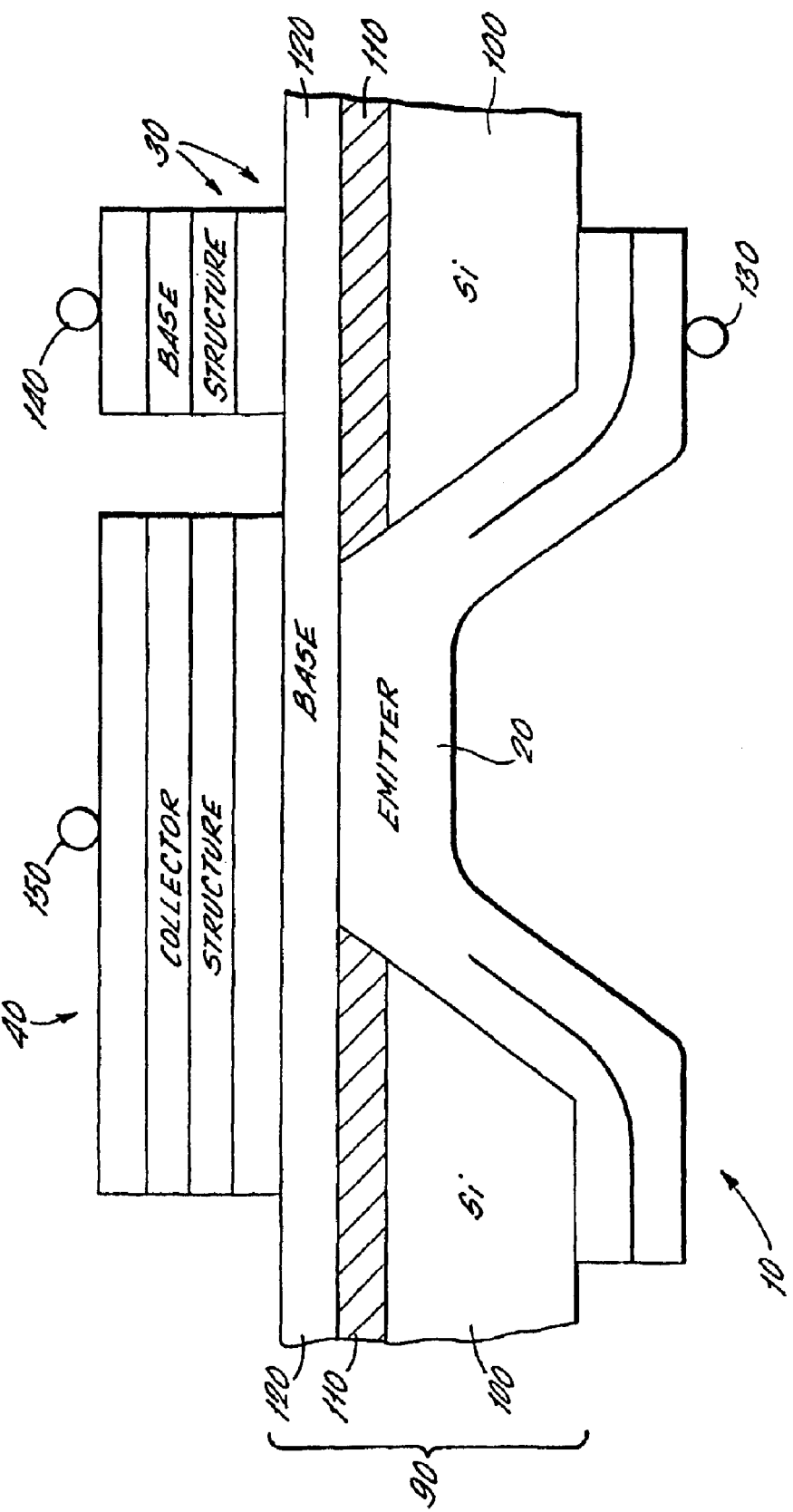
FIG. 2 shows a schematic sectional view of the geometric layout of a spin transistor embodying the present invention.

Turning now to FIG. 2, a schematic sectional view of the geometric layout of a spin transistor embodying the present invention is shown. As described in FIG. 1, the device comprises an emitter 20, a collector 40 and a base 30. The structure is fabricated around a silicon on insulator (SOI) wafer 90 which, in the present example, comprises a thick (0.5 mm) layer 100 of silicon. The silicon layer 100 is used only for providing mechanical strength to the structure, and may therefore be of indifferent quality. The SOI wafer 90 also includes an insulating silicon oxide layer 110, and a further base layer 120 formed of device quality silicon. The base layer 120 is typically around 200 nm (2000 Angstroms) thick and forms the active regions of the device, in particular the base 30 of FIG. 1. Commercially available SOI wafers may be obtained with the base layer 120 already doped to the required dopant concentration. It is also possible to purchase the SOI wafers with the base layer undoped, such that they may subsequently be doped by ion implantation according to more specific requirements.

The collector 40, base 30 and emitter 20 are fabricated around the SOI wafer 90 in a manner to be described in connection with FIGS. 4a to 4h below. Emitter, base and collector electrodes 130, 140, 150 are bonded to the structure to allow contact to the spin transistor 10. It is to be noted that the emitter structure is formed in a "pit" within the SOI wafer 90, and this is an important feature of the spin transistor 10; the advantages will be explained, again in connection with FIGS. 4a to 4h.

Figure 3:
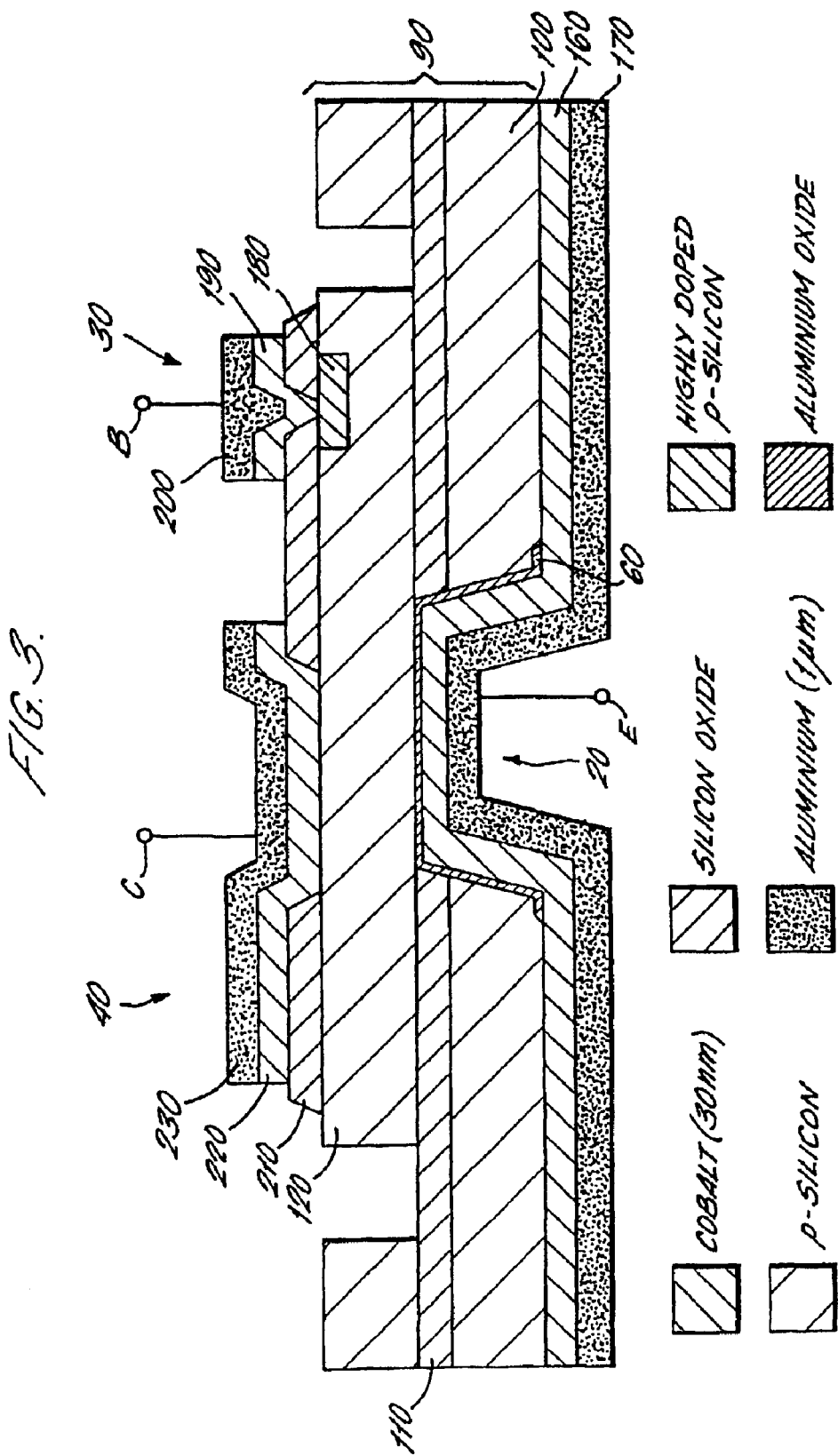
FIG. 3 shows a more detailed sectional view of the geometric layer of the spin transistor of FIG. 2.

FIG. 3 shows a more detailed sectional view of the geometrical layout of the spin transistor 10 of FIG. 2. Once again, it will be seen that the spin transistor includes three distinct regions, defining an emitter 20, a base 30 and a collector 40. The emitter is a multilayer structure formed within a pit on the SOI wafer 90. The base 30 and collector 40 are likewise multilayer structures, formed on the opposite side of the SOI wafer 90.

More specifically, the spin transistor 10 of FIG. 3 includes an SOI wafer 90 having a silicon layer 100, a device quality base layer 120 and an insulating silicon oxide layer 110 sandwiched between the two. A pit is formed through the silicon layer 100 and silicon oxide layer 110 of the SOI wafer 90, as seen in FIG. 3. An insulating layer of aluminium oxide is laid down in the base of that pit and along the side walls thereof, to form the emitter tunnelling barrier 60. A 30 nm layer 160 of cobalt is formed on top of the aluminium oxide layer within the pit, and a 1 micron thickness layer 170 of aluminium is formed on top of the cobalt to allow electrical connection to the device.

On the upper side of the device, a heavily-doped region 180 is formed in the base layer 120. A base structure 30 is then formed on top of that, the base structure comprising a further cobalt layer 190 and a further aluminium layer 200. The further cobalt and aluminium layers 190, 200 are spaced from the upper surface of the base layer 120 by an insulating layer 210 of silicon oxide over a proportion of their width, but the cobalt layer 190 directly contacts the base layer 120.

The collector is formed in a similar manner, with further cobalt and aluminium layers 220, 230 being spaced, along a part of their length, from the base layer 120, again using the insulating layer of silicon oxide 210, but again with a proportion of the width of the cobalt directly contacting the base layer 120.

A process for fabricating a spin transistor in accordance with aspects of a preferred embodiment of the present invention will now be described with reference to FIGS. 4*a* to 4*h*.

Referring first to FIG. 4*a*, a silicon-on-insulator (SOI) wafer 100 is shown. This is in the form it might be received when purchased commercially. The SOI wafer 90, as previously described, includes a 0.5 mm thick layer of silicon 100, an insulating layer of silicon oxide 110, and a base layer 120 which is approximately 200 nanometers (2000 angstrom) thick and is formed of device quality p-typed doped silicon.

Figure 4B:
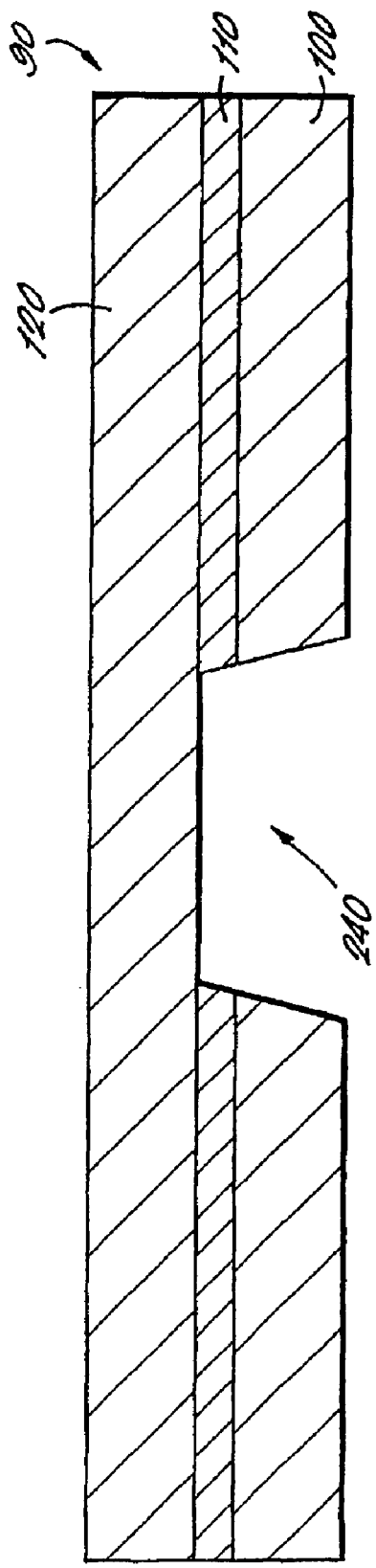

The first step in the process is the formation of a "pit" 240 in the underside of the SOI wafer 90. The pit is etched through the silicon layer 100 and the silicon oxide layer 110 to expose the under-surface of the base layer 120. The preferred method of forming the pit, which as shown in FIG. 4*b* is generally concave in shape, is to employ photolithography followed by a wet etch. The etch is programmed to stop when it is detected that the underside of the base layer 120 has been exposed.

As with other fabricated silicon devices, the resulting structure may be "vertical" or "lateral". It is important to keep the physical separation of the emitter 40 and base 30 as small as possible, in the present case, in order to reduce carrier storage in the base, keep the frequency response high, reduce recombination in the base which curtails the gain of the spin transistor 10, and to keep the base path length less than the spin diffusion length, the latter being the characteristic length scale on which the spins depolarize. It is for this reason that the vertical structure, using the pit 240, is preferred.

Having etched the pit 240 into the underside of the SOI wafer 90, the doped silicon base layer 120 is next etched. This isolates a region 250 of the base layer 120 surrounding the pit 240, as shown in FIG. 4*c*. In the preferred embodiment, photolithography and a wet etch are employed. Although this is the preferred technique, a dry etch or a reactive ion etch could be used instead.

Next, and as shown in FIG. 4*d*, a region 180 of the base region 250 is subjected to a boron ion beam which increases the doping concentration of the base region 250 at that point to form a heavily doped region 180. After that, a silicon oxide insulating layer 185 is sputter deposited onto the top of the base layer 120 to cover the base region 250.

A lithography process, followed by a wet etch is then employed to cut back the silicon oxide layer 185 as shown in FIG. 4*e*.

The upper surface (as seen in FIG. 4*f*) of the base region 250 is cleaned using a plasma treatment, to strip off any oxidised silicon. A light scour from an ion beam, or the application of HF could also be used instead. Immediately following the cleaning step, aluminium is deposited upon the upper surface of the device to coat the silicon oxide insulating layer and the upper surface of the base upper 250. After that, the device is exposed to a partial pressure of oxygen for 30 seconds, so that an aluminium oxide layer 260 is produced, for use in the formation of, for example, a tunnelling junction barrier or Schottky barrier between the base and collector. This is in contrast to the device of FIG. 3, which has no aluminium oxide layer in the base or collector regions. The aluminium in the device of FIGS. 4*a*–4*h* is laid down to a thickness such that the resulting aluminium oxide is approximately 10–15 Angstroms (1–1.5 nm) thick.

Figure 4G:
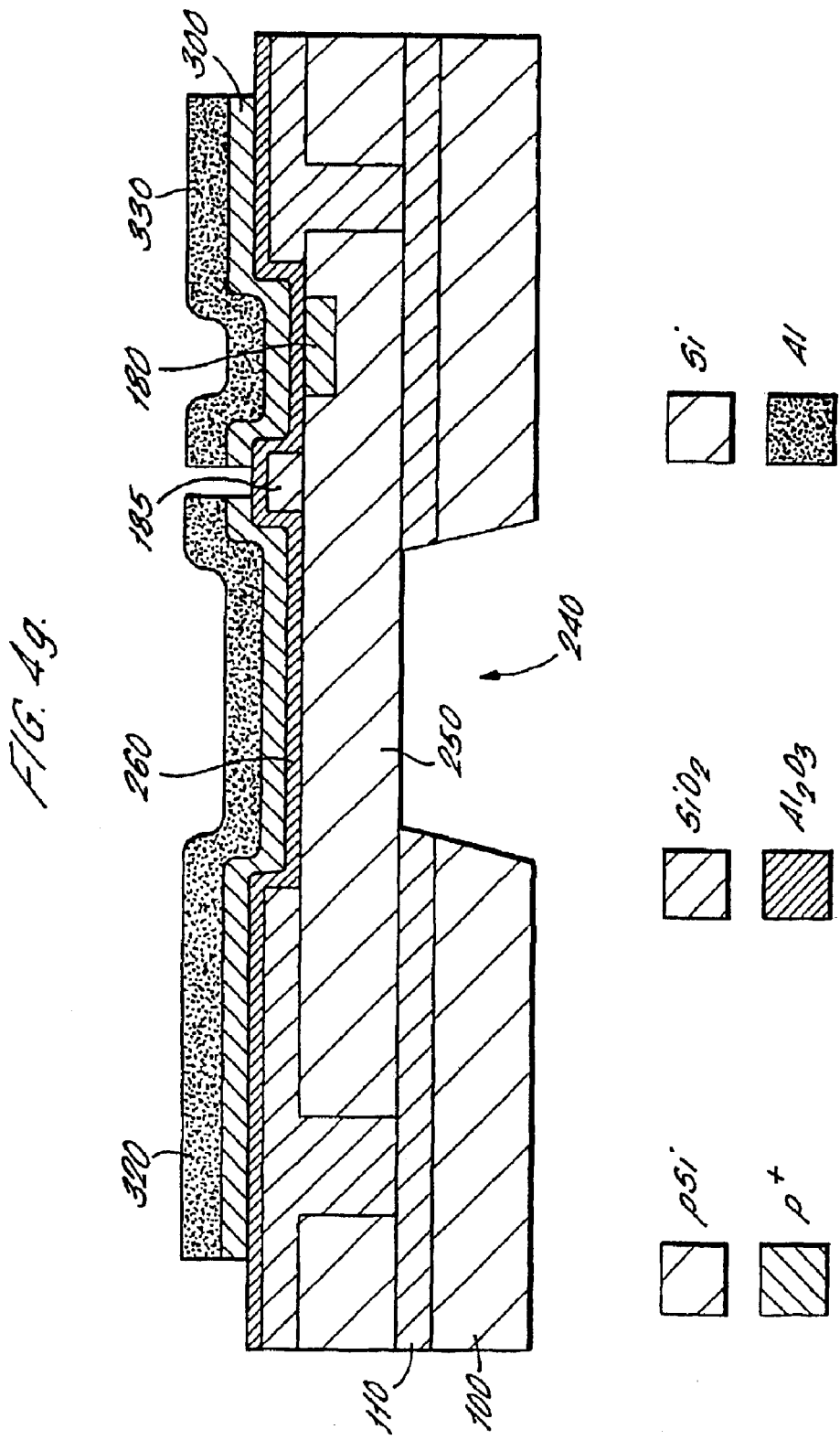

The oxygen is immediately pumped out after the 30 second treatment and a 30 nm thick layer of cobalt is evaporated or sputter deposited onto the aluminium oxide layer 260, as seen in FIG. 4*g*. After that, an aluminium layer is deposited upon the cobalt layer to a thickness of 1 micron, and photolithography is subsequently used, followed by a wet etch, to form two separate regions. The first region, constituted by a cobalt layer 290 and an aluminium layer 320, forms a collector region, and the cobalt layer 290 acts as the spin filter 70 of FIG. 1. A second region constitutes a base contact region and is made up of a base cobalt layer 300 and an aluminium layer 330. The surface area of the collector cobalt layer 290 in contact with the aluminium oxide layer 260 is approximately 25 microns×25 microns. The surface area of the base cobalt layer 300 is approximately 15 microns×15 microns.

A similar technique to that described in connection with FIGS. 4*f* and 4*g* is then employed to lay down the emitter region. The underside of the base region 250 is cleaned using a plasma mill or etch, and aluminium is then deposited across this and into the pit 240. The aluminium is oxidised in a partial pressure of oxygen for 30 seconds to form an aluminium oxide layer 280, approximately 10–15 Angstroms (1–1.5 nm) thick. The aluminium oxide layer 280 forms the tunnelling junction barrier 60 shown in FIG. 1. Cobalt and aluminium are then successively sputter deposited onto the aluminium oxide layer 280, to form an emitter cobalt layer 310 and an emitter aluminium layer 340 respectively.

The approximate surface area of the emitter cobalt layer 310, where it is formed in the upper, horizontal part of the pit 240 (FIG. 4*h*) is approximately 60 microns×60 microns. This part of the emitter cobalt layer 310 forms the spin polarizer 50 of FIG. 1.

The aluminium layers 320, 330, 340 are preferable to allow external contacts to the spin transistor 10 to be made. This is because ultrasonic bonds may readily be formed. However, it is to be understood that gold films may also be satisfactorily bonded to gold wire by thermal compression bonding, and, instead of collector, base and emitter aluminium layers 320, 330 and 340, gold could be deposited instead.

Collector, base and emitter electrodes 350, 360 and 370 are finally bonded onto the collector, base and emitter aluminium layers 320, 330 and 340 respectively.

Figure 4H:
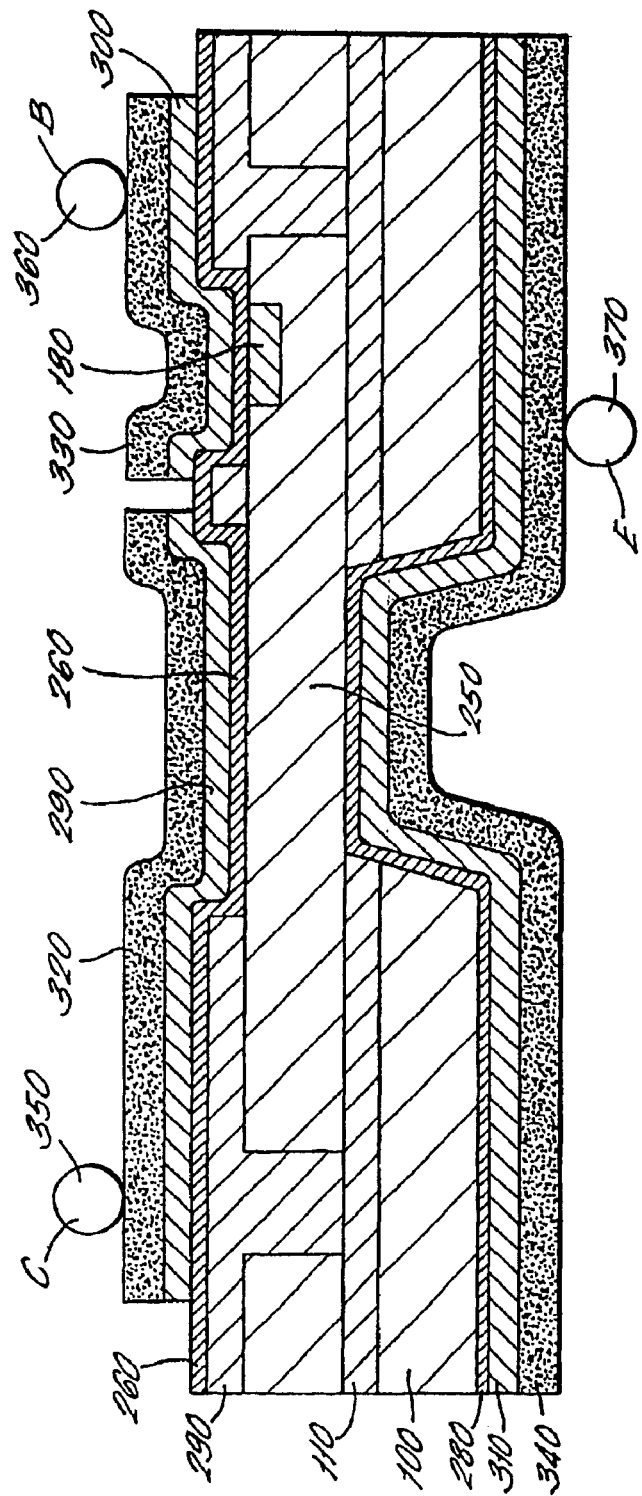

As previously explained, the dimensions in the spin transistor 10 of FIG. 4*h* principally affecting performance are the vertical dimensions, which are governed by the thickness of the base layer 120. The lateral scales of the spin transistor 10 of FIG. 4*h* are readily obtainable using optical lithography.

A further embodiment of a spin transistor may be fabricated by reducing the dimensions of the base region. At a certain point, the capacitance of the base region becomes so small that addition of a single electron raises its electrostatic energy by an amount large compared with the average thermal quantum (kT, where k is the Boltzmann constant and T is the absolute temperature), and this gives rise to additional spin-dependent effects, including the possibility of a spin accumulation in the base region 250. The spin effects are reflected in quantization of the transconductance of the device. Such devices are, however, relatively complex, owing to the double band structure in the base, and the role of increased combination time which is a consequence of the reduced dimensionality, and also require high resolution techniques to fabricate because of the very small size of base region that is required. Electron beam lithography, or a focussed ion beam (acting as an ion mill) might then be employed.

A further variation on the single electron device is realized by applying a static electricity pulse to the tunnelling junction barrier, as described previously, to form small metallic islands at the semiconductor interface. This provides a coulomb blockaded spin tunnel transistor.

The use of a tunnelling barrier reduces the formation of suicides and other contaminants, since a silicon/insulator interface is formed, rather than a silicon/metal interface. Thus, there is a significant reduction in spin depolarization relative to the prior art. Moreover, the tunnelling barrier height and width may be readily varied, and this in turn allows the point of injection into the band - structure of the silicon base to be varied over a wide range whilst maintaining constant injection current density. The spin injection energy may then be selected so as to maximise the spin sensitivity of the spin transistor.

The collector may further include a second tunnelling barrier, Schottky barrier, Ohmic barrier or p-n semiconductor junction for removal of the spin-polarized carriers from the semiconductor base.

Preferably, the spin polarizer includes a spin asymmetric material to write the spin information to the charge carriers. The spin analyser may likewise include a spin asymmetric material to read the spin information imparted by the spin polarizer. The spin asymmetric material may, for example, be a ferromagnetic metal, such as cobalt. In this case, the magnetization of the spin polarizer relative to the spin analyser may be differentially switched by the application of an external magnetic field. This in turn modifies the transfer functions of the spin transistor. In that case, the coercive fields of the emitter and collector should differ. In the present case, the transfer functions may include the transconductance, defined as $dI(n)/dV(m)$, the current gain, defined as $dI(n)/dI(m)$, and voltage gain which is defined as $dV(n)/dV(m)$. n and m are defined as the first and second of a given pair of terminals in the device respectively. In the case of a three-terminal device, n and m represent the collector and base, collector and emitter, and base and emitter.

The spin transistor may include a further magnetic element incorporated into the base structure, to provide additional magnetic functionality. This potentially allows the transfer functions between more than one pair of ports to be magnetically dependent. The additional magnetic element may, in one embodiment, have a coercive field which is different to the coercive fields of the spin polarizer and spin analyser. In another embodiment, the coercive field of the additional magnetic element may be substantially the same as the coercive fields of the spin polarizer and spin analyser.

Preferably, the spin polarizer further comprises a first semiconductor element for transferring spin-polarized carriers into the base. Likewise, the spin analyser may further comprise a second semiconductor element for transferring spin-polarized carriers from the base.

The spin polarizer, or spin filter may be formed of a magnetic semiconductor material such as Cadmium Mercury Telluride, for example. Similarly, the semiconductor base may also include such a magnetic semiconductor material.

Preferably, the device is formed as a thin film structure.

Preferably, the step of forming the third region defining the collector further comprises forming a collector tunnelling barrier between the said spin analyser and the semiconductor base, for removing the spin-polarized carriers from the said base. In that case, after the collector tunnelling barrier has been formed, the method may further comprise applying a breakdown voltage to the spin transistor, the breakdown voltage applied being of sufficient magnitude to cause breakdown of the collector tunnelling barrier into a Schottky barrier.

This method of forming a Schottky barrier between the base and collector is particularly advantageous. Indeed, the procedure is not restricted to the formation of a Schottky barrier in the spin transistor of the invention. The present invention thus also provides a method of forming a Schottky barrier, comprising forming a composite structure including a metallic layer, a tunnelling barrier layer and a semiconductive layer, the tunnelling barrier layer being formed between the said metallic layer and the said semiconductive layer; and applying a breakdown voltage to the said composite structure, the breakdown voltage being of sufficient magnitude to cause breakdown of the tunnelling barrier layer into a Schottky barrier layer.

An Ohmic interface may be formed by a similar technique. In yet a further aspect of the invention, there is provided a method of forming an Ohmic interface layer between a metallic and a semiconductive layer, comprising forming a composite structure including a metallic layer, a tunnelling barrier layer and a heavily doped semiconductive layer, the tunnelling barrier layer being formed between the said metallic layer and the said heavily doped semiconductive layer; and applying a breakdown voltage to the said composite structure, the breakdown voltage being of sufficient magnitude to cause breakdown of the tunnelling barrier layer into an Ohmic interface layer.

By "heavily doped" it is meant that the semiconductive region has sufficient numbers of dopant ions that the Fermi energy is almost in the conduction band. This level of doping is referred to in the art as "p+" or "n+" doping. In that case, the interface layer becomes Ohmic. The technique is particularly advantageous in the formation of Ohmic contacts (electrodes) onto a silicon material.

Emitter, base and collector electrodes may be formed on the surfaces of the emitter, base and collector respectively. A base-tunnelling barrier may be formed between the base electrode and the base. In that case, a breakdown voltage may again be applied to cause breakdown of the base-tunnelling barrier into a further Schottky barrier.

When the semiconductor base is heavily doped, application of a breakdown voltage may cause the collector-tunnelling barrier to break down instead into an Ohmic barrier.

Whilst a number of embodiments of the invention have been described, it will be appreciated that various modifications may be made. For example, although each of the described embodiments are three terminal devices, four or more terminal devices may be fabricated using the same principles. Therefore, the scope of protection is to be determined solely by the following claims.

What is claimed is:

1. A spin transistor comprising a first region defining an emitter, a second region defining a semiconductor base, and a third region defining a collector, wherein:

the emitter includes a spin polarizer for spin-polarizing charge carriers to be injected from the emitter to the base; and the collector includes a spin filter for spin-filtering charge carriers received at the collector from the base;

characterized in that the emitter further includes a tunnelling barrier arranged to tunnel inject the spin-polarized charge carriers into the semiconductor base.

2. The spin transistor of claim 1, in which the collector further includes a second tunnelling barrier for removal of the spin-polarized carriers from the semiconductor base.

3. The spin transistor of claim 1, in which the collector further includes a Schottky barrier for removal of the spin-polarized carriers from the semiconductor base.

4. The spin transistor of claim 1, in which the collector further includes an Ohmic interface for removal of the spin-polarized carriers from the semiconductor base.

5. The spin transistor of claim 1, in which the collector further includes a p-n semiconductor junction for removal of the spin-polarized carriers from the semiconductor base.

6. The spin transistor of any preceding claim, in which the spin polarizer is formed of a spin asymmetric material.

7. The spin transistor of claim 6, in which the spin polarizer further comprises a first semiconductor element for transferring spin polarized carriers into the base.

8. The spin transistor of claim 6, in which the spin filter is formed of a spin asymmetric material.

9. The spin transistor of claim 8, in which the spin filter further comprises a second semiconductor element for transferring spin-polarized carriers from the base.

10. The spin transistor of claim 8, in which the spin polarizer is differentially switchable with respect to the spin filter by the application of an external magnetic field.

11. The spin transistor of claim 8, in which the spin asymmetric material includes a ferromagnetic material.

12. The spin transistor of claim 11, in which the ferromagnetic material is Cobalt.

13. The spin transistor of claim 8, in which the base includes a further magnetic element.

14. The spin transistor of claim 13, in which the spin polarizer and spin filter have first and second coercive fields and the further magnetic element has a third coercive field which is differs from at least one of the first and second coercive fields.

15. The spin transistor of claim 1, in which the tunneling barrier is formed of Aluminum Oxide.

16. The spin transistor of claim 1, in which the emitter and collector are respectively formed on first and second opposing faces of a doped semiconductor layer of a silicon-on-insulator (SOI) wafer, the doped semiconductor layer constituting at least a part of the said semiconductor base.

17. The spin transistor of claim 16, in which the SOI wafer further includes a substrate layer having a recess formed therein, the emitter being formed at least partly within the recess so as to abut the first opposing face of the doped semiconductor layer, the collector abutting the second opposing face thereof.

* * * * *

UNITED STATES PATENT AND TRADEMARK OFFICE
CERTIFICATE OF CORRECTION

PATENT NO. : 6,919,608 B2
DATED : July 19, 2005
INVENTOR(S) : John Francis Gregg It is certified that error appears in the above-identified patent and that said Letters Patent is hereby corrected as shown below:

Column 2,
Line 39, delete the word "suicides" and insert -- silicides --;

Column 9,
Line 18, delete the word "suicides" and insert -- silicides --.
Line 46, delete the word "mare" and insert -- m are --.

Signed and Sealed this

Eleventh Day of October , 2005

JON W. DUDAS
*Director of the United States Patent and Trademark Office*